United States Patent [19]

Silberberg

[11] 4,115,733

[45] Sep. 19, 1978

[54] DIGITAL DISPLAY PLUG-IN

[75] Inventor: Jeffrey L. Silberberg, Beltsville, Md.

[73] Assignee: The United States of America as represented by of the Department of Health, Education and Welfare, Washington, D.C.

[21] Appl. No.: 724,248

[22] Filed: Sep. 17, 1976

[51] Int. Cl.² .................... G01R 17/06; G01R 15/08
[52] U.S. Cl. ................................ 324/99 D; 324/114; 324/115
[58] Field of Search .................... 324/99 D, 115, 114

[56] References Cited

PUBLICATIONS

1970 Instrumentation Catalog; Systron–Donner, 2315 Whitney Ave., Hamden, Conn. 06518; p. 78, front cover.

*Primary Examiner*—Rudolph V. Rolinec
*Assistant Examiner*—Ernest F. Karlsen
*Attorney, Agent, or Firm*—Browdy and Neimark

[57] ABSTRACT

A readout device connected to a parent metering system contains a digital display for circumventing the non-linearity of analog meter movement in the parent system. The readout device displays both numerical and dimensional information in a clear, legible form with both probe and range scale factors accounted for in the display itself. A "probe" switch on the front panel of the module encodes the logarithm of the scale factor associated with the probe in use to a two's complement binary number, and the full scale range information from the "range" switch is encoded in the same manner. This information, along with function information from the "function" switch, is processed by a scale computation circuit which positions the decimal point and causes the units of measurement to be indicated accordingly.

6 Claims, 3 Drawing Figures

DIGITAL DISPLAY PLUG-IN

FIELD OF THE INVENTION

This invention relates to digital modules which can be used in conjunction with parent metering systems for converting analog measurement to digital measurement, and has particular utility in converting the analog output of a Victoreen 555 exposuremeter into digital form.

BACKGROUND OF THE INVENTION

Most measuring instruments in use today utilize an analog meter in displaying the measured information. While these devices are quite economical, non-linearity in the analog meter movement can produce errors. Additionally, these types of meters are hard to accurately read due to the small size of the meter screen.

Furthermore, most of these analog metering devices contain range switches which must be interpreted along with the reading on the screen. In other words, if the range switch is positioned, for example, on an X10 scale, a reading on the meter must be multiplied by a factor of 10. This calculation is mentally or manually accomplished by the operator and can lead to misreading of the meter, expecially when many readings are taken.

One such metering device is the Victoreen Model 555 radiation measurement system which is currently in use by Food and Drug Administration personnel in determining the exposure achieved by medical X-ray equipment. Although the 555 can be used to make highly accurate measurements, performance is degraded slightly by nonlinearities in the analog meter movement, and errors in determining the scale factor can occur in the midst of multiple tedious test procedures.

SUMMARY OF THE INVENTION

It is accordingly an object of the present invention to overcome the defects of the prior art as mentioned above.

Another object of the present invention is to provide for converting analog meter movements into a digital display.

A further object of the present invention is to produce a digital module which automatically positions the decimal point in the correct location.

Still another object of the present invention is to produce a digital module which correctly displays dimensional information.

Yet another object of the present invention is to produce a digital module which requires only one calibration and automatically accounts for all scale factors.

Another object of the present invention is to produce a digital module which can be used in conjunction with a Victoreen 555 exposuremeter.

These and other objects of the present invention are accomplished by the use of a novel digital display module comprised of a digital panel meter, a message display unit and CMOS digital integrated circuits. This module contains a scale computation unit which automatically takes into account the range, function and probe information of each particular reading. According to this information, the scale computation unit correctly positions the decimal point in the digital panel meter and also denotes the correct units of measurement. The digital panel meter is connected to a recorder output of the metering device by means of a voltage divider circuit which attenuates this output. The use of the digital panel circumvents the non-linearity in the analog meter movement.

The above and other objects and advantages of this invention will be apparent from the following description of an embodiment of this invention, reference being made to the accompanying diagram. The particular circuits shown in these drawings are not to be limitative since one possessing normal skill in the art may make changes in the circuitry without departing from the scope of the invention. Furthermore, it should be noted that while the present invention has been described in conjunction with the Victoreen 555 exposuremeter, it will be appreciated that this was done only for the sake of clarity and ease of understanding, and that the present invention may be used in conjunction with substantially all metering devices utilizing an analog meter movement.

DETAILED DESCRIPTION OF A PREFERRED EMBODIMENT

Figure 1:
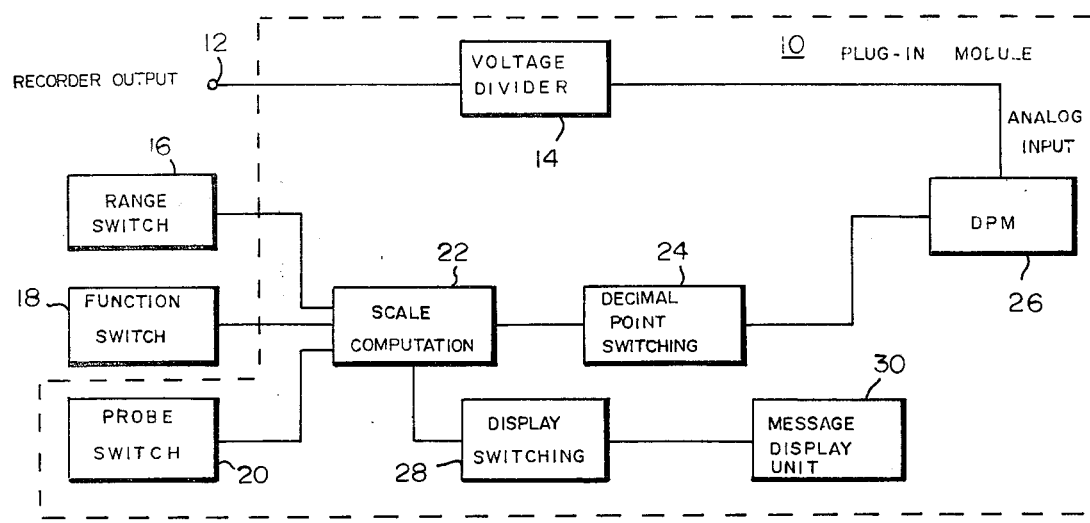
FIG. 1 is a block diagram of the digital display module.

FIG. 1 shows a block diagram of the digital display module 10 (area within dashed lines) connected to any metering device having a recorder output 12, range switch 16 and function switch 18. The recorder output 12 exhibits excellent linearity and is attenuated enroute to a digital panel meter (DPM) 26 by means of a voltage divider 14 such that the number 1,000 displayed on the DPM 26 corresponds to a full scale deflection of the analog meter in the measuring device. A "probe" switch 20 on the front panel of the module encodes the logarithm of the scale factor associated with the particular probe in use to a two's complement binary number, with the full scale range information from the "range" switch 16 and the "function" switch 18 being encoded in a similar manner. It should be noted that the probe switch 20 is needed due to the different scale factors of the many probes which are in use. If only one probe is to be used, this switch 20 is unnecessary and the proper scale factor can be permanently wired into the circuit.

The encoded information from the switches 16, 18 and 20 is processed by a scale computation circuit 22, which is connected to decimal point switching circuit 24 for correctly positioning the decimal point. This is quite important since the range information is automatically included on the display, necessitating an accurate representation of the correct decimal point location. The scale computation circuit 22 is also connected to a message display unit 30 through display switching circuit 28 for selecting the correct units of measurement. The logarithmic coding of the switch positions reduces scale computation to simple binary addition, eliminating the need for electronic multipliers (See FIG. 2).

Resolution and accuracy of the digital panel meter 26 are such that full system accuracy is maintained using the ×10 scales of the range switch only. Therefore, to allow simplification of the circuitry, the module enters a standby mode on any ×3 scale, thereby giving a blanking condition to the digital panel meter 26 without terminating the power.

Figure 2:
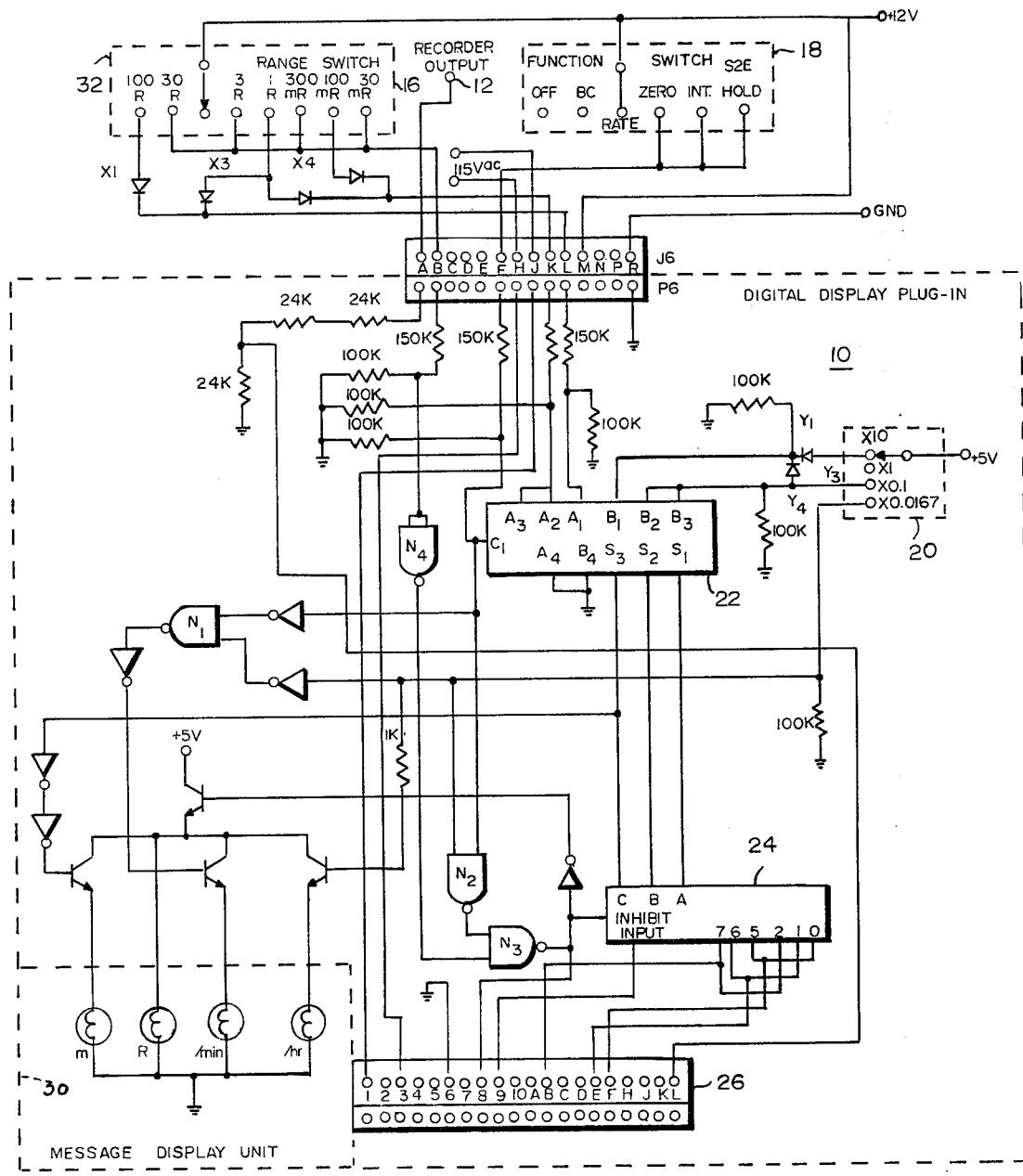
FIG. 2 is a schematic diagram of the digital display module connected to a Victoreen 555 exposure meter.

FIG. 2 shows a circuit diagram of the digital display plug-in 10 and its connection to a metering device having recorder output 12, range switch 16, and function switch 18. This figure shows that the recorder output 12 (which usually varies between 0 and −30V) of the Victoreen metering device can be attached to a pin A of a plug-in socket J6 which connects the two devices. A precision 3:1 resistive divider 14 can be used to supply the analog input of the digital panel meter 26 (such as a Weston model 1221) with a 0 to 10V signal range. Resistors of 1% tolerance, ± 100 ppm/° C. or better are recommended for this voltage divider. The voltage panel meter is calibrated to read 500 when the analog panel meter is at half of its full scale, and the display's minus sign is disabled so that a negative voltage input results in a readout of positive units.

The scale computation circuit 22, which consists of a simple binary adder (such as an RCA CD4008AE), receives scale information from the range switch 16 and the probe switch 20 in the form of two's complement binary numbers (See Table Ia).

Table I a. Range Switch Coding

| Scale | Boolean Variable | | Two's Complement Binary Code $A_3A_2A_1$ | Decimal Representation of Code |
|---|---|---|---|---|
| 10 R/m, | 100 R | $x_1$ | 001 | 1 |
| 1 R/m, | 10 R | $x_2$ | 000 | 0 |
| 100m R/m, | 1 mR | $x_3$ | 111 | −1 |
| 10m R/m, | 100 mR | $x_4$ | 110 | −2 | b. Probe Switch Coding

| Scale | Boolean Variable | Two's Complement Binary Code $B_3B_2B_1$ | Decimal Representation of Code |
|---|---|---|---|
| ×10 | $y_1$ | 001 | 1 |
| ×1 | $y_2$ | 000 | 0 |
| ×0.1 | $y_3$ | 111 | −1 |
| ×0.0167 | $y_4$ | 000 | 0 |

Digital logic signals entering the plug-in module are applied to 2.5:1 voltage dividers so that a +12V on an input line will be recognized as a logical "1" by the CMOS logic, which operates on a 5Vdc power supply. The plug-in contains its own 5Vdc power supply so that the circuitry of the plug-in does not load the dc supplies of the parent meter.

Codes from the range switch are fed to junctions $A_1$, $A_2$ and $A_3$ of the binary adder. The (Boolean) logical equations $A_1 = x_1 + x_3$, $A_2 = x_3 + x_4$, and $A_3 = A_2$ generate the required codes for the four range switch positions in which the digital display module is operational and are implemented with the diode-resistor logic shown in FIG. 2. The logic signal originating from the function switch 18 is a logical "1" in the zero, integrate, and hold positions only, and feeds the "carry input" ($C_i$) of the binary adder. The Boolean variable associated with the function switch 18 is thus added to the two's complement-code from the range switch 16, which has the effect of multiplying the full scale range by 10 when $C_i$ is a logical "1". This adjusts for the factor of 10 difference between the rate and integrate full-scale ranges at each position of the range switch.

The probe switch 20 is coded in a manner similar to the range switch 16 with one exception: in the rate mode, the ×10, ×1 and ×0.1 positions of the probe switch cause "(m)R/min" to appear in the message display unit, while the ×0.0167 position causes "(m)R/hr" to be displayed when this device is used in conjunction with the Victoreen 555 exposuremeter. Thus, for determination of decimal point location the ×1 and ×0.0167 positions generate the same two's complement code. By examination of Table Ib it can be seen that $B_1 = y_1 + y_3$, $B_2 = y_3$, and $B_3 = B_2$, where $B_1$ is implemented with diode-resistor logic.

Although the CD4008AE is a four bit adder, only the first three bits are used. Codes from the three switches are added, and the sum code is used to control an 8-channel multiplexer (such as an RCA-CD4051AE). This multiplexer is, in this case, used as a demultiplexer, with the "decimal point common" signal (pin 9) being routed to pins B, E, or F on the digital panel meter to light the proper decimal point. Since the multiplexer outputs are labeled according to the natural binary value of the control input, the sum of the switch codes is interpreted as indicated in Table II. From an examination of this Table it can be seen that the decimal point is positioned between the two leftmost digits when the multiplexer input is connected to either output 0 or 5, in the center of the display when either output 1 or 6 is activated, and between the two rightmost digits when either output 2 or 7 is activated. Binary codes 3 and 4 cause no decimal point to light. It should be noted that the sum of the switch codes, in two's complement binary, is the logarithm of the full scale range.

Table II

| Sum of Switch Codes $S_3S_2S_1$ | Decimal Representation of Two's Complement Binary | Decimal Representation of Natural Binary | Full Scale Range |
|---|---|---|---|
| 011 | 3 | 3 | 1000 R |
| 010 | 2 | 2 | 100.0 R |
| 001 | 1 | 1 | 10.00 R |
| 000 | 0 | 0 | 1.000 R |
| 111 | −1 | 7 | 100.0 mR |
| 110 | −2 | 6 | 10.00 mR |
| 101 | −3 | 5 | 1.000 mR |

The message display unit 30 will be described in relation to the use of the digital display module 10 in conjunction with the Victoreen 555 exposure meter. It can, however, be appreciated that the dimensional units which are shown here can be changed when the display module is used with another type of meter. This display unit consists of four compartments, each opening at one end to photographic film bearing the legends "m", "R", "/min", and "/hr", each illuminated by an incandescent lamp (#1738). These lamps are driven by transistors such as 2N4123 configured as emitter followers, with a transistor similar to MJE340 used to supply current to the display unit. An RCA CD4049AE inverter can be used to supply sufficient base current to activate the 2N4123 transistors. The "m" legend is illuminated whenever $S_3$ is a logical "1" (see Table II). $C_i$ is a logical 1 when the function switch is in the zero, integrate, or hold positions and is inverted and NANDed with $y_4$ from the probe switch, such that the rate mode causes the "/min" legend to be illuminated when the probe switch is in the ×10, ×1, or ×0.1 positions. When the probe switch is in the ×0.0167 position, $N_1$ is disabled, the "/min" legend extinguishes, and the "/hr" legend is illuminated. The "R" legend is continuously illuminated (as well as whichever of the "m", "/min", and "/hr" legends is applicable) unless a blanking condition exists.

A blanking condition (standby mode) occurs whenever the range switch is positioned to a ×3 scale or the function switch is not in the rate position when ×0.0167 is selected via the probe switch. $N_2$ detects the latter condition while $N_4$ is used to indicate the former, and either condition forces the output of $N_3$ to a logical "1." A logical "1" on the inhibit line of the 8-channel multiplexer causes its input to be disconnected from all outputs, permitting no decimal point to be displayed. The same logic level on pin 8 of the digital panel meter causes a "1" to flash in the most significant digit position, while the remaining three digits are blanked. The output of $N_3$ is inverted prior to connection to the base of a transistor arranged between a 5 volt supply terminal and the "R" lamp, as well as the collector of each of the three transistors having their emitters connected to the display unit, and since no base current is supplied to this first transistor during a blanking condition, the entire message display unit is extinguished.

Figure 3:
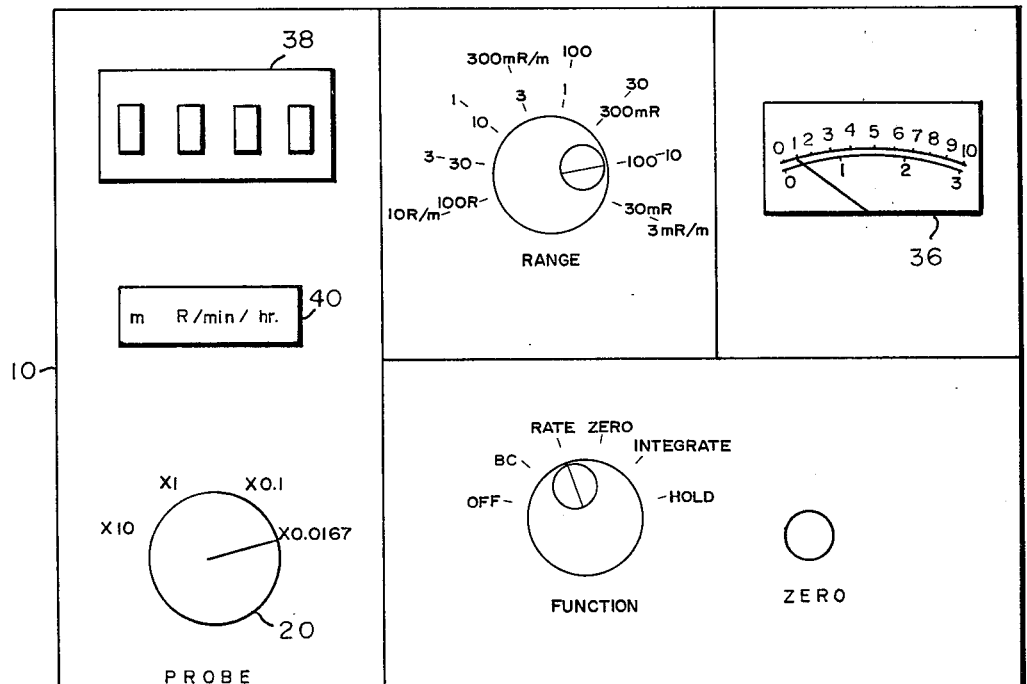
FIG. 3 is a somewhat simplified front view of the digital display module connected to the Victoreen 555 exposuremeter.

As previously stated, the present invention has particular utility when used in conjunction with a Victoreen 555 exposure meter since relatively few modifications are required on the 555 mainframe for proper operation of the digital display plug-in module. FIG. 3 shows the digital display plug-in when it is installed in the optional timer trip compartment of the 555. As shown in FIG. 2, a wafer 32 is added to the range switch 16 and four diodes are connected as shown. Unused positions of the switch wafer are used as terminals, and wires are connected to pin B, K, and L of the plug-in socket J6 as shown. The switch wiper of the 555 is connected to pin M on the plug-in socket J6. The mounting of the diodes on the water, rather than in the plug-in, reduces the required number of connector pins on J6 by one.

The wire connecting pin J on J6 (115 VAC) to a contact on the function switch is shorted to the wiper of the same switch, thus applying the digital display module with 115 VAC in the rate, zero, integrate, and hold modes. If it is desirable to maintain compatibility with the timer trip plug-in, the wire from pin J on J6 can remain in place and a wire can be connected from the wiper to pin P on the plug-in socket; A.C. power would then be delivered to the digital display module on pins H and P of J6.

The wiper of the function switch 18 to which pin F of J6 is connected, in the zero, integrate and hold modes is connected to +12.0 volts D.C. rather than to 115 volts A.C.

While the above invention has been described in great detail, it can be appreciated that various changes can be made in the circuitry of this invention without departing from its scope. Additionally, it should be noted that while this invention was described in conjunction with the Victoreen 555 exposure meter, other meters may be utilized by employing only minor modifications to the present invention.

What is claimed is:

1. A metering arrangement comprising:
   a parent metering system having a probe, a range switch, a function switch and an analog meter; and
   a device for automatically converting analog information from said parent metering system into digital form and for displaying the information in digital form, the device including:
   digital display means for converting and displaying a digital output in response to an analog signal of the parent metering system, said digital display means having one input coupled to an output from said parent metering circuit;
   message display means for displaying the proper dimensions of the digital output;
   scale computation means coupled to said range switch and to said function switch for processing signals received therefrom representing function and scale information;
   circuit means coupled between an output from said computation means and said digital display means for positioning a decimal point in said digital display means; and
   means coupled between an output from said computation means and said message display means for selecting correct message units on said message display means.

2. A metering arrangement according to claim 1, further including a probe switch means connected to an input of said scale computation means for providing a signal representing information of scale factor pretaining to the probe used to said scale computation means.

3. A metering arrangement according to claim 1, further including a voltage divider connected between the analog output of the parent metering system and said digital display means for attenuating the output from the parent system fed to said one input of said digital display means.

4. A metering arrangement according to claim 1, wherein said scale computation means comprises a binary adder and means for encoding the logarithms of signals representing full scale range and function information into two's complement binary numbers.

5. A metering arrangement according to claim 4, further including a probe switch means connected to an input of said scale computation means for providing a signal representing information of scale factor pretaining to the probe used to said scale computation means, and wherein said scale computation means includes means for encoding the longarithm of the signal representing the scale factor of the probe into a two's complement binary number.

6. A metering arrangement according to claim 1, wherein said curcuit means for positioning the decimal point comprises a demultiplexer.

* * * * *